US008680898B2

(12) United States Patent
Tsukashima

(10) Patent No.: US 8,680,898 B2
(45) Date of Patent: Mar. 25, 2014

(54) MULTIPLIER CIRCUIT WITH IMPROVED WIDE BAND TRIPLED WAVE OUTPUT

(75) Inventor: Koji Tsukashima, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/369,514

(22) Filed: Feb. 9, 2012

(65) Prior Publication Data

US 2012/0200333 A1 Aug. 9, 2012

(30) Foreign Application Priority Data

Feb. 9, 2011 (JP) ................................ 2011-026507

(51) Int. Cl.
*H03B 19/00* (2006.01)

(52) U.S. Cl.
USPC ............................ 327/116; 327/119; 333/218

(58) Field of Classification Search
USPC .................................. 327/116, 119; 333/218
See application file for complete search history.

(56) References Cited

U.S. PATENT DOCUMENTS 4,308,473 A * 12/1981 Carnes .......................... 327/113
5,392,014 A * 2/1995 Nishida et al. ................ 333/218
6,529,051 B2 * 3/2003 Tokumitsu et al. ........... 327/119

FOREIGN PATENT DOCUMENTS

JP 7-336145 A 12/1995
JP 2001-111348 A 4/2001
JP 2003-069344 A 3/2003
JP 2007-215247 A 8/2007

* cited by examiner

*Primary Examiner* — Kenneth B. Wells
(74) *Attorney, Agent, or Firm* — Westerman, Hattori, Daniels & Adrian, LLP

(57) ABSTRACT

A multiplier circuit including; a 90 degrees coupler that divides an input signal into a first input signal and a second input signal of which phase difference of a base wave is 90 degrees; a first transistor that receives the first input signal and outputs a first output signal including at least a doubled wave and a tripled wave of the first input signal; a second transistor that receives the second input signal and outputs a second output signal including at least a doubled wave and a tripled wave of the second input signal; and a combiner that restrains leakage of the first output signal or the second output signal from one of the first transistor and the second transistor to the other, combines the first output signal and the second output signal, and outputs an output signal of the tripled wave.

14 Claims, 12 Drawing Sheets

MULTIPLIER CIRCUIT WITH IMPROVED WIDE BAND TRIPLED WAVE OUTPUT

CROSS-REFERENCE TO RELATED APPLICATION

This application is based upon and claims the benefit of priority of the prior Japanese Patent Application No. 2011-026507, filed on Feb. 9, 2011, the entire contents of which are incorporated herein by reference.

BACKGROUND (i) Technical Field

The present invention relates to a multiplier circuit.

(ii) Related Art

Recently, a millimeter waveband has a wide available frequency band. Therefore, there is a demand for a wide band device. In particular, there is a demand for an ultra wide band device using an E-band within 60 GHz to 96 GHz.

Japanese Patent Application Publication No. 2007-215247 (hereinafter referred to as Document 1) discloses an example of a multiplier circuit that has a filter circuit, triples an input signal, and outputs the tripled signal.

SUMMARY

It is difficult to improve the output of the tripled wave in a wide band with preferable characteristics, when the multiplier circuit has a filter circuit including an LC circuit as in the case of Document 1.

When a frequency of a base wave of an input signal is 20 GHz to 32 GHz, frequency bands of a doubled wave and a tripled wave are 40 GHz to 64 GHz and 60 GHz to 96 GHz respectively. Therefore, the frequency band of the doubled wave overlaps with that of the tripled wave. It is therefore difficult to extract the tripled wave effectively even if a filter or a trap circuit is used.

It is an object to provide a multiplier circuit that is capable of improving an output of a tripled wave in a wide band.

According to an aspect of the present invention, there is provided a multiplier circuit including: a 90 degrees coupler that divides an input signal into a first input signal and a second input signal of which phase difference of a frequency of a base wave of the input signal is 90 degrees, and outputs the first input signal and the second input signal; a first transistor that receives the first input signal and outputs a first output signal including at least a doubled wave and a tripled wave of the first input signal; a second transistor that receives the second input signal and outputs a second output signal including at least a doubled wave and a tripled wave of the second input signal; and a combiner that receives the first output signal and the second output signal, restrains leakage of the first output signal or the second output signal from one of the first transistor and the second transistor to the other, combines the first output signal and the second output signal, and outputs an output signal of the tripled wave.

According to another aspect of the present invention, there is provided a multiplier circuit including: a coupler that divides an input signal into a first input signal and a second input signal having a phase difference of 90 degrees to the first input signal; a first transistor that receives the first input signal and outputs a first output signal including at least a doubled wave and a tripled wave of the first input signal; a second transistor that receives the second input signal and outputs a second output signal including at least a doubled wave and a tripled wave of the second input signal; and a combiner that combines the first output signal and the second output signal, and outputs an output signal of the tripled wave.

DETAILED DESCRIPTION

Figure 1:
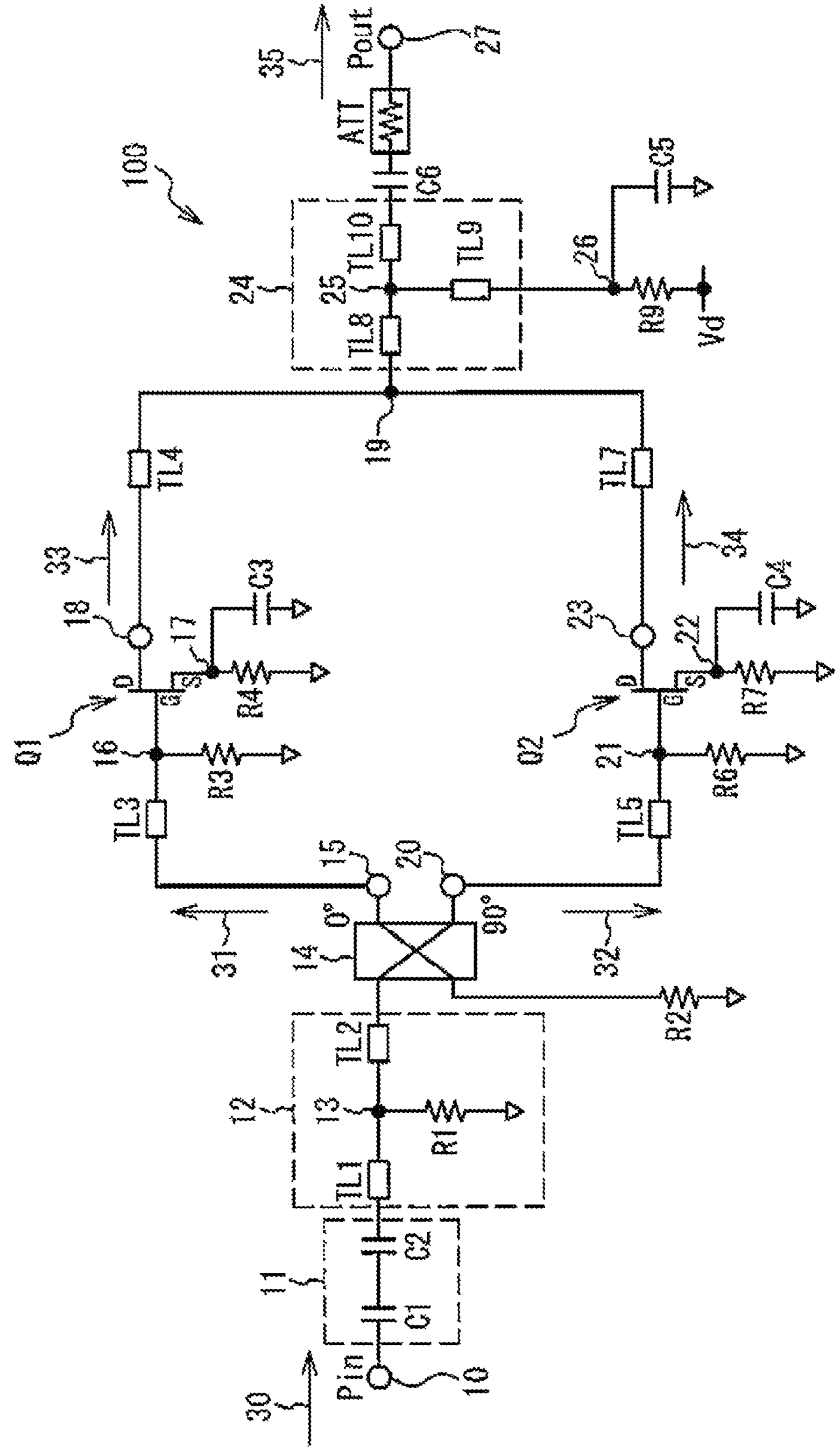
FIG. 1 illustrates a circuit diagram of a multiplier circuit in accordance with a comparative example.

A description will be given of a comparative example for comparison with an embodiment of the present invention. FIG. 1 illustrates a circuit diagram of a multiplier circuit 100 in accordance with the comparative example. As illustrated in FIG. 1, the multiplier circuit 100 has an input signal terminal (Pin) 10, a circuit for protecting electrostatic discharge 11 (hereinafter referred to as an ESD protect circuit 11), an input matching circuit 12, a 90 degrees coupler 14, a first transistor Q1, a second transistor Q2, an output matching circuit 24, an output signal terminal (Pout) 27. An input signal 30 is input into the Pin 10. An output signal 35 is output from the Pout 27.

The ESD protect circuit 11 has a capacitors C1 and C2. The capacitors C1 and C2 are coupled in series. The capacitor C1 is coupled to the Pin 10. The capacitor C2 is coupled to the input matching circuit 12. The ESD protect circuit 11 prevents circuit destruction caused by electrostatic discharge. Although the ESD protect circuit 11 has two capacitors, the number of the capacitors may be different from two (for example, one).

The input matching circuit 12 has distributed constant lines TL1 and TL2 and a resistor R1. A first terminal of the distributed constant line TL1 is coupled to the ESD protect circuit 11. A second terminal of the distributed constant line TL1 is coupled to a first terminal of the distributed constant line TL2 via a coupling point 13. The first terminal of the distributed constant line TL2 is coupled to the second terminal of the distributed constant line TL1 via the coupling point 13. A second terminal of the distributed constant line TL2 is coupled to the 90 degrees coupler 14. A first terminal of the resistor R1 is coupled to the coupling point 13. A second terminal of the resistor R1 is coupled to the ground. The input matching circuit 12 matches between impedance of a circuit (not illustrated) or the like acting as an output source of the input signal 30 and impedance of the multiplier circuit 100.

The 90 degrees coupler 14 divides the input signal 30 into a first input signal 31 and a second input signal 32 having phase difference of 90 degrees from each other, and outputs the first input signal 31 and the second input signal 32 to a terminal 15 and a terminal 20 respectively. A resistor R2 coupled between the 90 degrees coupler 14 and the ground is a terminal resistor of the 90 degrees coupler 14.

A description will be given of a structure of a line (hereinafter referred to as a first line) from the terminal 15 to a coupling point 19 via the first transistor Q1. A first terminal of a distributed constant line TL3 is coupled to the terminal 15. A second terminal of the distributed constant line TL3 is coupled to a gate terminal ("G" in FIG. 1) acting as a first input terminal of the first transistor Q1. The distributed constant line TL3 adjusts the phase of the first input signal 31. A first terminal of a resistor R3 is coupled to a coupling point 16 coupling the distributed constant line TL3 and the gate terminal of the first transistor Q1. A second terminal of the resistor R3 is coupled to the ground. The resistor P3 regulates a bias voltage of the first transistor Q1.

The first input signal 31 is input to the gate terminal ("G" in FIG. 1) acting as the first input terminal of the first transistor Q1. A drain terminal acting as the first output terminal of the first transistor Q1 outputs a first output signal 33 including a base wave, a doubled wave, a tripled wave, quadrupled wave and so on (hereinafter referred to as harmonic components). An n-times wave ("n" is an integer that is 1 or more) of the first input signal 31 is a signal having n-times frequency as the frequency of the base wave of the first input signal 31. The first input signal 31 having the phase of zero degree is input to the gate terminal of the first transistor Q1. The drain terminal ("D" in FIG. 1) of the first transistor Q1 is coupled to the distributed constant line TL4 via the terminal 18. A source terminal ("S" in FIG. 1) of the first transistor Q1 is coupled to a first terminal of a resistor R4. A second terminal of the resistor R4 is coupled to the ground. A coupling point 17 coupling the source terminal of the first transistor Q1 and the resistor R4 is coupled to a first terminal of a capacitor C3. A second terminal of the capacitor C3 is coupled to the ground. The resistor R4 grounds the first transistor Q1 with respect to direct current. The capacitor C3 grounds the first transistor Q1 with respect to high frequency wave. A first terminal of a distributed constant line TL4 is coupled to the terminal 18. A second terminal of the distributed constant line TL4 is coupled to the coupling point 19. The coupling point 19 is coupled to the output of the first transistor Q1 and the output of the second transistor Q2. The first output signal 33 and a second output signal 34 described later are input to the coupling point 19 in common.

A structure of a line from a terminal 20 to the coupling point 19 via the second transistor Q2 (hereinafter referred to as a second line) is the same as the first line. The second input signal 32 is input to a gate terminal acting as the second input terminal of the second transistor Q2. A drain terminal acting as a second output terminal of the second transistor Q2 outputs the second output signal 34 including the harmonic components of the second input signal 32. The other structure is the same as the first line. Therefore, an explanation of the structure is omitted. The terminals 20 and 23, the distributed constant lines TL5 and TL7, the resistors R6 and R7, the capacitor C4 and the coupling points 21 and 22 of the second line correspond to the terminals 15 and 18, the distributed constant lines TL3 and TL4, the resistors R3 and R4, the capacitor C3 and the coupling points 16 and 17 of the first line respectively.

The output matching circuit 24 has a distributed constant lines TL8, TL9 and TL10. The output matching circuit 24 matches the impedance of the multiplier circuit 100 and the impedance of a circuit (not illustrated) or the like to which the output signal 35 is output. A first terminal of the distributed constant line TL8 is coupled to the coupling point 19. A second terminal of the distributed constant line TL8 is coupled to a coupling point 25 coupling the distributed constant lines TL9 and TL10. A first terminal of the distributed constant line TL9 is coupled to the coupling point 25. A second terminal of the distributed constant line TL9 is coupled to a first terminal the resistor R9. A first terminal of the distributed constant line TL10 is coupled to the coupling point 25. A second terminal of the distributed constant line TL10 is coupled to a first terminal of a capacitor C6. The power supply Vd supplies a bias voltage to the first transistor Q1 and the second transistor Q2. A first terminal of the resistor R9 is coupled to a coupling point 26. A second terminal of the resistor R9 is coupled to the power supplies Vd and adjusts the bias voltage. A first terminal of the capacitor C5 is coupled to the coupling point 26. A second terminal of the capacitor C5 is coupled to the ground. The capacitor C5 grounds the distributed constant line TL9 and the resistor R9 with respect to high frequency wave. A first terminal of the capacitor C6 is coupled to the second terminal of the distributed constant line TL10. A second terminal of the capacitor C6 is coupled to a first terminal of an attenuator ATT and cuts direct components of the output signal 35. A first terminal of the attenuator ATT is coupled to the second terminal of the capacitor C6. A second terminal of the attenuator ATT is coupled to the Pout 27. The Pout 27 outputs the output signal 35. The attenuator ATT is provided to isolate a signal from the Pout 27. The attenuation amount of the attenuator ATT is, for example, −2 dB.

A description will be given of an operation of the multiplier circuit 100 with reference to FIG. 1. The input signal 30 is input to the Pin 10. The input signal 30 is input to the 90 degrees coupler 90 via the ESD protect circuit 11 and the input matching circuit 12. The 90 degrees coupler 14 divides the input signal 30 into the first input signal 31 and the second input signal 32 having the phase difference of 90 degrees from each other, and outputs the first input signal 31 and the second input signal 32 to the terminal 15 of the first line and the terminal 20 of the second line respectively. In the following description, the phase of the base wave of the first input signal 31 and the second input signal 32 is assumed to be 0 degree and 90 degrees. The first input signal 31 is input to the gate terminal of the first transistor Q1. The drain terminal of the first transistor Q1 outputs the first output signal 33 including harmonic components of the first input signal 31. The second input signal 32 is input to the gate terminal of the second transistor Q2. The drain terminal of the second transistor Q2 outputs the second output signal 34 including harmonic components of the second input signal 32.

A description will be given of the doubled wave, the tripled wave, and the quadrupled wave included in the first output signal 33 and the second output signal 34. The phase of the base wave is referred to as $\phi$. The phase of the n-times wave is n X $\phi$. For example, it is assumed that the phase of the base wave is 90 degrees. In this case, the phase of the doubled wave is 180 degrees (=90×2 degrees). The phase of the base wave of the first output signal 33 is zero degree. Therefore, the phase of the doubled wave, the tripled wave and the quadruped wave of the first output signal 33 is zero degree. The phase of the base wave of the second output signal 34 is 90 degrees. Therefore, the phase of the doubled wave, the tripled wave and the quadruped wave of the second output signal 34 is 180 degrees, 270 degrees, and 360 degrees. Accordingly, phase difference between the doubled waves, the tripled waves and the quadruped waves of the first output signal 33 and the second output signal 34 is 180 degrees, 270 degrees and 360 degrees respectively. The phase difference between the doubled wave of the first output signal 33 and the doubled wave of the second output signal 34 is 180 degrees. Therefore, the output of the doubled wave may be suppressed.

The first output signal 33 is input to the coupling point 19 via the distributed constant line TL4. The second output signal 34 is input to the coupling point 19 via the distributed constant line TL7. The first output signal 33 and the second output signal 34 are input to the coupling point 19 in common and are combined. The output signal 35 in which the first output signal 33 and the second output signal 34 are combined is output from the output signal terminal Pout 27 via the output matching circuit 24, the capacitor C6 and the attenuator ATT.

Table 1 shows examples of parameter of each element during a simulation of frequency characteristics of the multiplier circuit 100 in accordance with the comparative example. Table 1 shows the resistance value [Ω] of resistors, capacitance [pF] of each capacitor, length (L) [μm] of each distributed constant line, and width (W) [μm] of each distributed constant line. A micro strip line was used as each distributed constant line. Polyimide was used as a dielectric body in which the distributed constant line is provided. In the comparative example, thickness of the dielectric body was 4.5 [μm], and relative permittivity was 3.5

TABLE 1

| | |
|---|---|
| R1 | 50 [Ω] |
| R2 | 50 [Ω] |
| R3 | 1000 [Ω] |
| R4 | 40 [Ω] |
| R6 | 1000 [Ω] |
| R7 | 40 [Ω] |
| R9 | 220 [Ω] |
| C1 | 0.75 [pF] |
| C2 | 0.75 [pF] |
| C3 | 0.75 [pF] |
| C4 | 0.75 [pF] |
| C5 | 0.75 [pF] |
| C6 | 0.3 [pF] |
| TL1 | L = 425 [μm], W = 8 [μm] |
| TL2 | L = 50 [μm], W = 8 [μm] |
| TL3 | L = 340 [μm], W = 10 [μm] |
| TL4 | L = 90 [μm], W = 10 [μm] |
| TL5 | L = 220 [μm], W = 10 [μm] |
| TL7 | L = 90 [μm], W = 10 [μm] |
| TL8 | L = 100 [μm], W = 10 [μm] |
| TL9 | L = 200 [μm], W = 10 [μm] |
| TL10 | L = 60 [μm], W = 10 [μm] |

Figure 2:
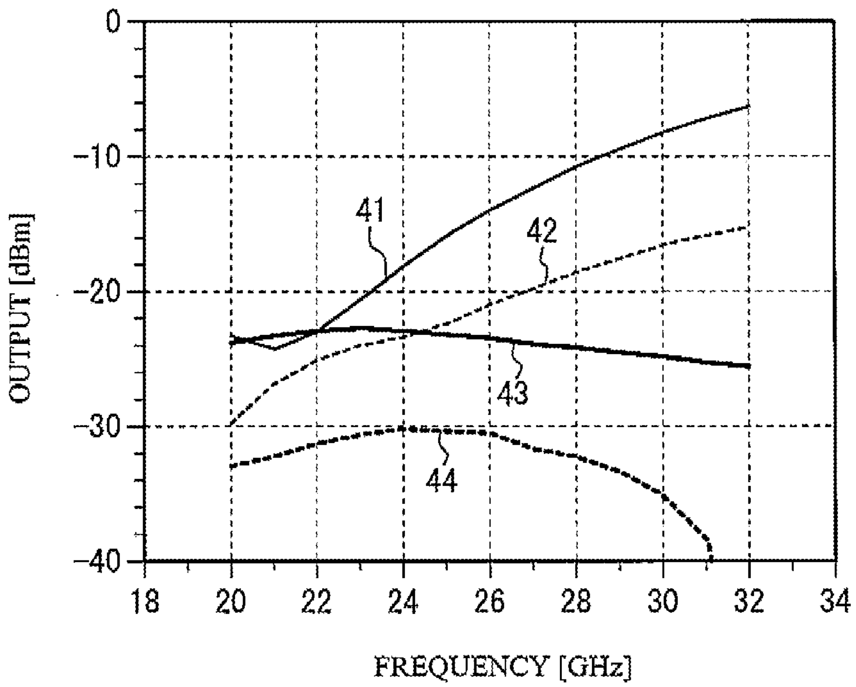
FIG. 2 illustrates an example of a simulation result of frequency characteristics of the multiplier circuit in accordance with the comparative example.

FIG. 2 illustrates an example of the simulation result of the frequency characteristics of the multiplier circuit 100 in accordance with the comparative example. In FIG. 2, a horizontal axis indicates a frequency [GHz], and a vertical axis indicates output [dBm]. A solid line 41, a dotted line 42, a solid line 43 and a dotted line 44 indicate changing of each output of the base wave, the doubled wave, the tripled wave, and the quadrupled wave in the output signal 35 of the multiplier circuit 100.

As illustrated in FIG. 2, the output of the tripled wave is larger than that of the doubled wave in a low frequency band (for example, approximately 20 GHz to 24 GHz). However, the output of the tripled wave is smaller than that of the doubled wave in a high frequency band (for example, approximately 24 GHz to 32 GHz). Contrary to expectations, the output of the doubled wave is not suppressed in a high frequency band with respect to the multiplier circuit 100. It is therefore difficult to improve the output of the tripled wave in a wide band.

A description will be given of embodiments for solving the above-mentioned problem.

First Embodiment

Figure 3:
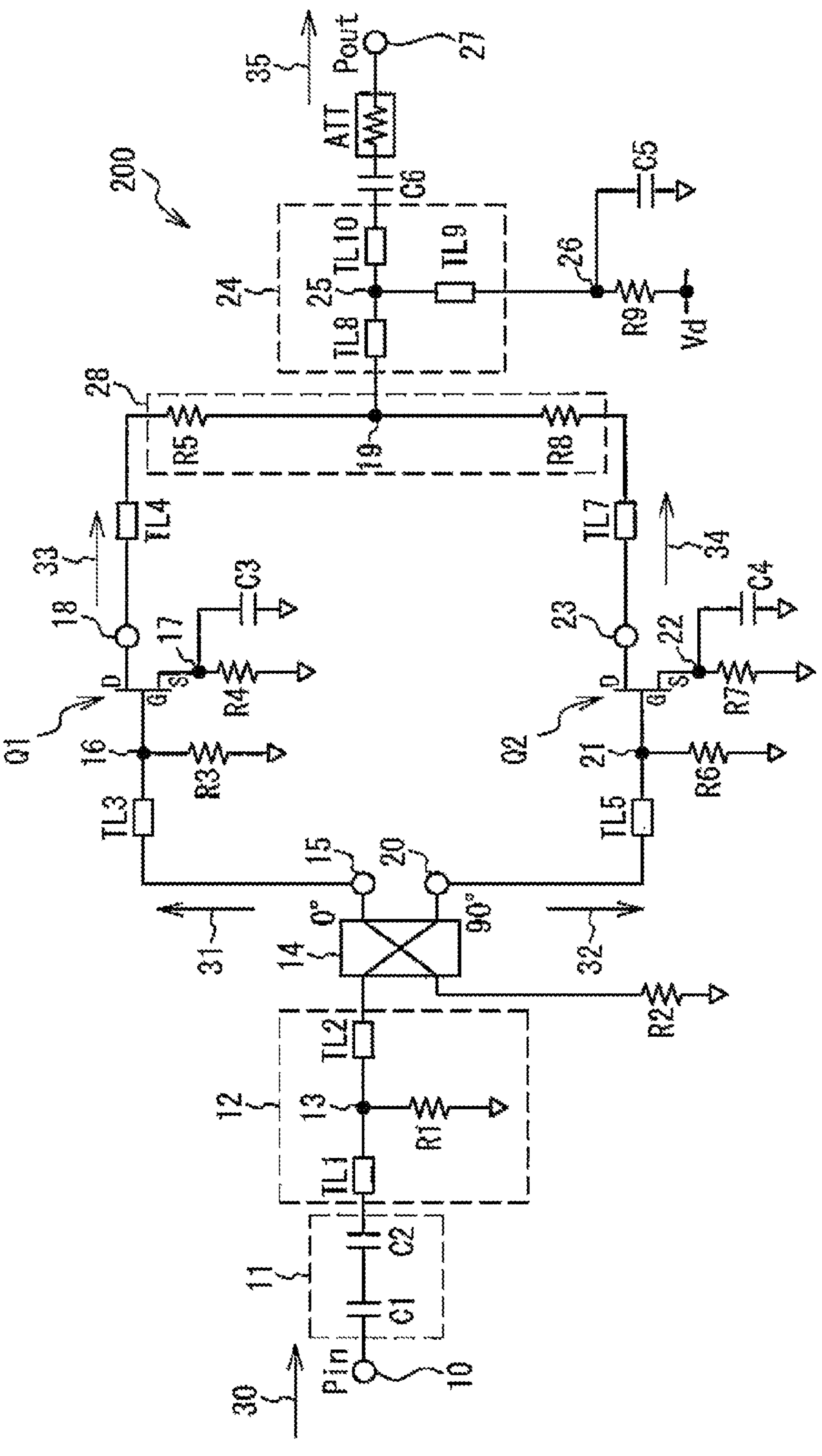
FIG. 3 illustrates a circuit diagram of a multiplier circuit in accordance with a first embodiment.

A description will be given of an example of a structure of a multiplier circuit in accordance with a first embodiment with reference to FIG. 3. FIG. 3 illustrates a circuit diagram of a multiplier circuit 200 in accordance with the first embodiment. The same components as those illustrated in FIG. 3 have the same reference numerals as FIG. 1. A description will be given of differences between the multiplier circuit 200 and the multiplier circuit 100. The other explanation is omitted.

The multiplier circuit 200 is different from the multiplier circuit 100 in a point that a combiner 28 is provided. The combiner 28 has the coupling point 19 to which the output of the first transistor Q1 and the output of the second transistor Q2 are coupled, the resistor R5 acting as a first resistor, and the resistor R8 acting as a second resistor. The combiner 28 is coupled to the drain terminal acting as the first output terminal of the first transistor Q1 and the drain terminal acting as the second output terminal of the second transistor Q2 via distributed constant line TL4 and the distributed constant line TL7 respectively. The first output signal 33 and the second output signal 34 are input to the combiner 28. The combiner 28 restrains leakage of the first output signal 33 or the second output signal 34 from one of the first transistor Q1 and the second transistor Q2 to the other. The combiner 28 combines the first output signal 33 and the second output signal 34, and outputs the output signal 35 of a tripled wave to the Pout 27 via the coupling point 19, the output matching circuit 24, the capacitor C6 and the attenuator ATT. The first terminal of the resistor R5 is coupled to the distributed constant line TL4. The second terminal of the resistor R8 is coupled to the coupling point 19. The first terminal of the resistor R8 is coupled to the distributed constant line TL7. The second terminal of the resistor R8 is coupled to the coupling point 19. The first output signal 33 and the second output signal 34 are input to the coupling point 19 in common.

Table 2 shows examples of parameter of each element during a simulation of frequency characteristics of the multiplier circuit 200 in accordance with the first embodiment. The elements showed in Table 1 are omitted in Table 2. It is preferable that the resistance value of the resistor R5 and the resistor R8 is equal to each other so that the balance of combining between the first output signal 33 and the second output signal 34 is equal to each other, and the bias of the first transistor Q1 and the second transistor Q2 is equal to each other.

TABLE 2

| | |
|---|---|
| R5 | 25 [Ω] |
| R8 | 25 [Ω] |

Figure 4:
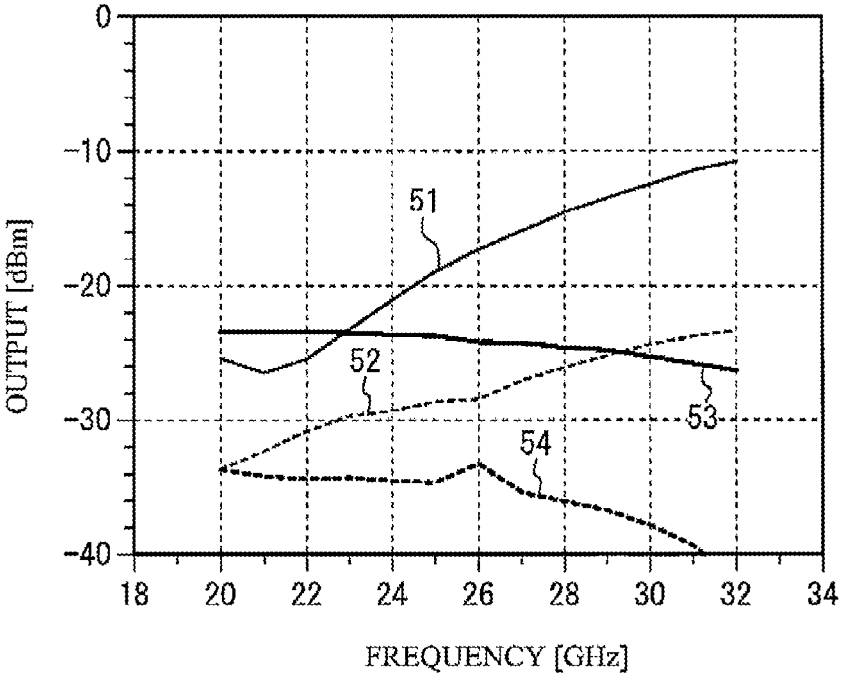
FIG. 4 illustrates an example of a simulation result of frequency characteristics of the multiplier circuit in accordance with the first embodiment.

FIG. 4 illustrates an example of simulation results of frequency characteristics of the multiplier circuit 200 in accordance with the first embodiment. In FIG. 4, a horizontal axis and a vertical axis are the same as FIG. 2. A solid line 51, a dotted line 52, a solid line 53 and a dotted line 54 indicate changing of a base wave, a doubled wave, a tripled wave and quadrupled wave in the output signal 35 of the multiplier circuit 200.

As illustrated in FIG. 4, the output of the doubled wave of the output signal 35 is suppressed compared to FIG. 2 of the comparative example. The output of the tripled signal of the output signal 35 gets larger in a wide band than the output of the doubled wave of the output signal 35.

In the comparative example, the first output signal 33 output from the first transistor Q1 flows into the second line having the second transistor Q2. In this case, harmonic components of the first output signal 33 and the second output signal 34 interfere with each other. This results in phase difference between the first output signal 33 and the second output signal 34. Similar phenomenon occurs on the second line when the second output signal 34 output from the second transistor Q2 flows into the first line having the first transistor Q1. The doubled waves having reverse phase cancel with each other when there isn't any phase difference. However, in the comparative example, the doubled waves having reverse phase strengthen with each other. It is therefore difficult to enlarge the output of the tripled wave in a wide band.

On the other hand, in the first embodiment, the resistors R5 and the resistor R8 in the combiner 28 restrain the flowing of the first output signal 33 into the second line and the flowing of the second output signal 34 into the first line. Thus, mutual influence between the first transistor Q1 and the second transistor Q2 is reduced. Therefore, the phase difference between each harmonic component of the first output signal 33 and the second output signal 34 is restrained. The output of the doubled wave of the output signal 35 is restrained in a wide band because the doubled wave of the first output signal 33 and the doubled wave of the second output signal 34 having reverse phase cancel with each other in a wide band. Therefore, the output of the tripled wave is enlarged in a wide band.

In accordance with the first embodiment, the multiplier circuit 200 has the 90 degrees coupler 14, the first transistor Q1, the second transistor Q2 and the combiner 28. The 90 degrees coupled 14 divides the input signal 30 input to the input signal terminal Pin 10 into the first input signal 31 and, the second input signal 32 of which base waves have a phase difference of 90 degrees, and outputs the first input signal 31 and the second input signal 32. The first input signal 31 is input to the gate terminal acting as the first input terminal of the first transistor Q2. The drain terminal acting as the first output terminal of the second transistor Q2 outputs the first output signal 33 including at least the doubled wave and the tripled wave of the first input signal 31. The second input signal 32 is input to the gate terminal acting as the second input terminal of the second transistor Q2. The drain terminal acting as the second output terminal of the second transistor Q2 outputs the second output signal 34 including at least the doubled wave and the tripled wave of the second input signal 32. The combiner 28 has the coupling point 19 to which the first output signal 33 and the second output signal 34 are input in common, the resistor R5 acting as the first resistor, and the resistor R8 acting as the second resistor. The first output signal 33 and the second output signal 34 are input to the combiner 28. The combiner 28 restrains leakage of the first output signal 33 or the second output signal 34 from one of the first transistor Q1 and the second transistor Q2 to the other. The combiner 28 combines the first output signal 33 and the second output signal 34, and outputs the output signal 35 of a tripled wave from the coupling point 19. The first terminal of the resistor R5 is coupled to the drain terminal of the first transistor Q1. The second terminal of the resistor R5 is coupled to the coupling point 19. The first terminal of the resistor R5 is coupled to the drain terminal of the second transistor Q2. The second terminal of the resistor R8 is coupled to the coupling point 19. Thus, mutual influence between harmonic components of the first output signal 33 and the second output signal 34 is reduced with each other. And the phase difference between the first output signal 33 and the second output signal 34 is reduced. Therefore, as is the case of FIG. 6, the doubled waves of the first output signal 33 and the second output signal 34 cancel with each other. The output of the doubled wave of the output signal 35 is restrained in a wide band. And, the output of the tripled wave of the output signal 35 is enlarged in a wide band compared to the output of the doubled wave of the output signal 35.

In accordance with the first embodiment, the combiner 28 has the coupling point 19 to which the first output signal 33 and the second output signal 34 are input in common, the resistor R5 acting as the first resistor, and the resistor R8 acting as the second resistor. The combiner 28 may have the coupling point 19 to which the output of the first transistor Q1 and the output of the second transistor Q2 are coupled and a resistor (one of the resistor R5 and the resistor R8) provided only one of between the coupling point 19 and the first transistor Q1 and between the coupling point 19 and the second transistor Q2. It is preferable that both the resistor R5 and the resistor R8 are provided so that the balance of combining between the first output signal 33 and the second output signal 34 is equal to each other, and the bias voltage of the first transistor Q1 and the second transistor Q2 is equal to each other. When the resistance value of the resistor R5 and the resistor R8 is equal to each other, further effect is obtained.

Second Embodiment

Figure 5:
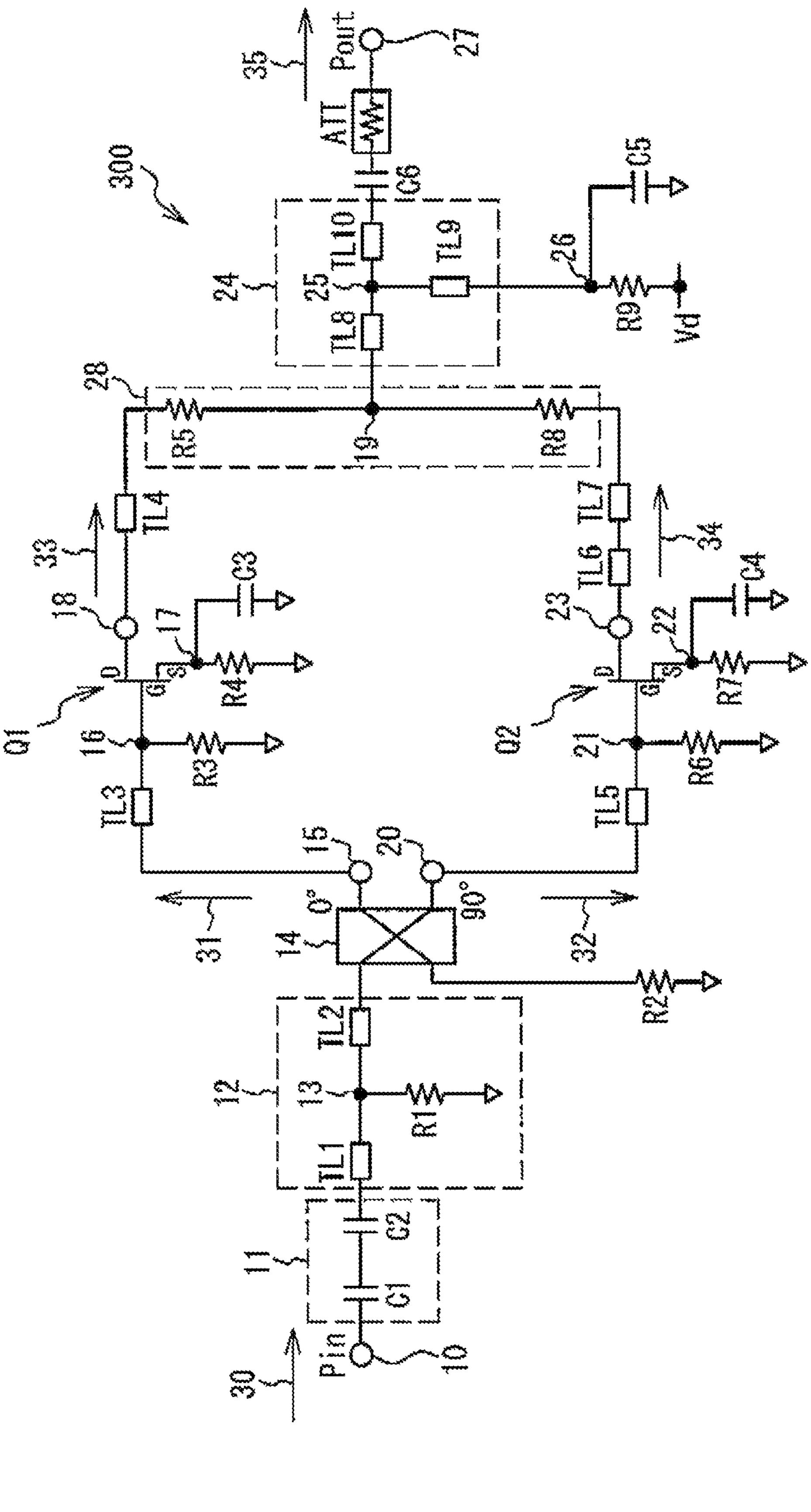
FIG. 5 illustrates a circuit diagram of a multiplier circuit in accordance with a second embodiment.

A description will be given of an example of a structure of a multiplier circuit in accordance with a second embodiment with reference to FIG. 5. FIG. 5 illustrates a circuit diagram of a multiplier circuit 300 in accordance with the second embodiment. The same components as those illustrated in FIG. 5 have the same reference numerals as FIG. 1. A description will be given of differences between the multiplier circuit 300 and the multiplier circuit 200 of the first embodiment. The other explanation is omitted.

The multiplier circuit 300 is different from the multiplier circuit 200 of the first embodiment in a point that the distributed constant line TL6 is provided. The first terminal of the distributed constant line TL6 is coupled to the drain terminal acting as the second output terminal of the second transistor Q2 via the terminal 23. The second terminal of the distributed constant line TL6 is coupled to the first terminal of the resistor R8 acting as the second resistor via the distributed constant line TL7. The distributed constant line TL6 adjusts the phase of the tripled wave of the second output signal 34 (270 degrees) closer to an in-phase (for example, 360 degrees or 720 degrees). Thus, the phase difference between the tripled wave of the first output signal 33 (0 degree) and the tripled wave of the second output signal 34 is reduced. Therefore, the output of the tripled wave of the output signal 35 is enlarged because the tripled wave of the first output signal 33 and the tripled wave of the second output signal 34 strengthen with each other.

Table 3 shows an example of parameter of each element of a simulation of frequency characteristics of the multiplier circuit 300 in accordance with the second embodiment. The elements showed in Table 1 or Table 2 are omitted. A micro strip line was used as the distributed constant line TL6. Polyimide was used as the dielectric body in which the distributed constant line is provided. In the embodiment, thickness of the dielectric body was 4.5 [μm], and relative permittivity was 3.5.

TABLE 3

| | |
|---|---|
| TL6 | L = 500 [μm], W = 10 [μm] |

Figure 6:
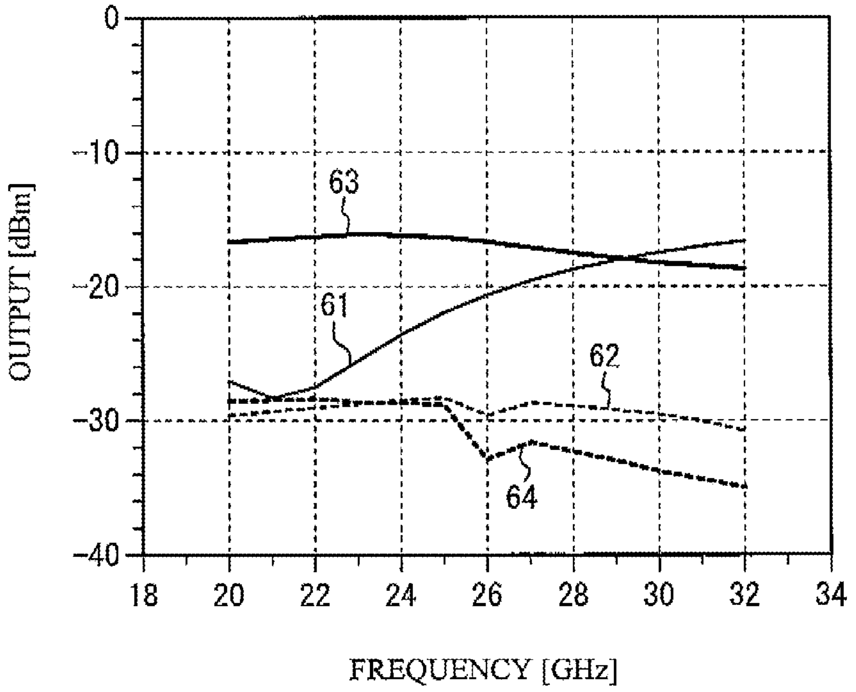
FIG. 6 illustrates an example of a simulation result of frequency characteristics of the multiplier circuit in accordance with the second embodiment.

FIG. 6 illustrates a simulation result of frequency characteristics of the multiplier circuit 300 in accordance with the second embodiment. In FIG. 6, a horizontal axis and a vertical axis are the same as FIG. 2. A solid line 61, a dotted line 62, a solid line 63 and a dotted line 64 indicate changing of the base wave, the doubled wave, the tripled wave and the quadruped wave of the output signal of the multiplier circuit 300 respectively. As illustrated in FIG. 6, the output of the tripled wave of the output signal 35 was further enlarged compared to FIG. 4 of the first embodiment. It is therefore possible to enlarge the output of the tripled wave in a wide band.

In accordance with the second embodiment, the multiplier circuit 300 has the distributed constant line TL6 in addition to the structure of the multiplier circuit 200. The first terminal of the distributed constant line TL6 is coupled to the drain terminal of the second transistor Q2. The second terminal of the distributed constant line TL6 is coupled to the first terminal of the resistor R8 acting as the second resistor via the distributed constant line TL7. The distributed constant line TL6 adjusts the phase of the tripled wave of the second output signal 34 (270 degrees) so that the phase difference between the tripled wave of the first output signal 33 and the tripled wave of the second output signal 34 gets closer to an in-phase. Thus, the output of the tripled wave of the output signal 35 is enlarged because the tripled wave of the first output signal 33 and the tripled wave of the second output signal 34 strengthen with each other as illustrate in FIG. 6. Therefore, the multiplier circuit 300 enlarges the output of the tripled wave in a wide band.

In accordance with the second embodiment, the multiplier circuit 300 has the distributed constant line TL6 on the side of the second line. The distributed constant line may be provided on the side of the first line. However, it is preferable that the distributed constant line TL6 is provide on the side of the second line and the phase of the second output signal 34 is delayed, because adjusting of phase gets easier.

Third Embodiment

Figure 7:
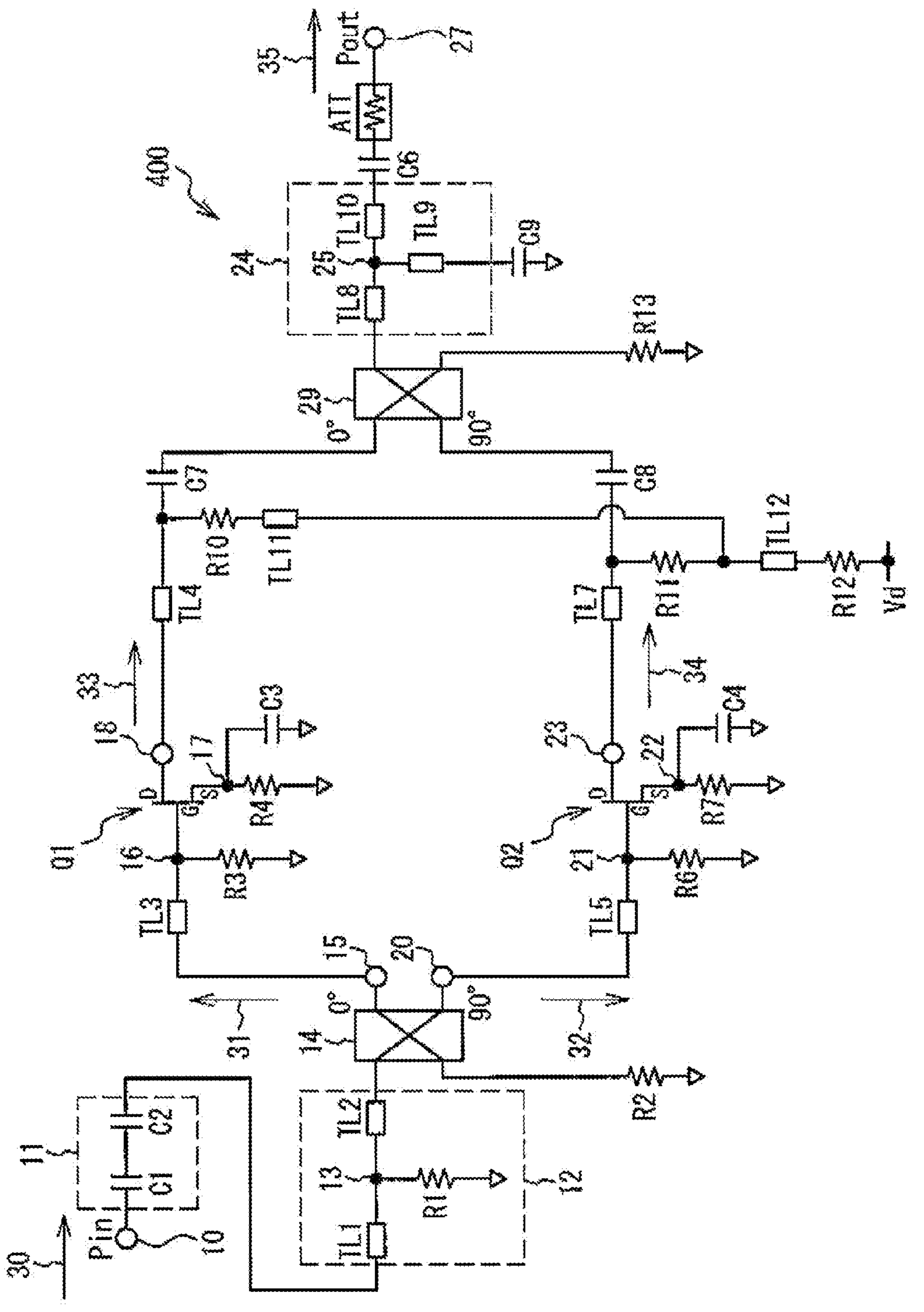
FIG. 7 illustrates a circuit diagram of a multiplier circuit in accordance with a third embodiment.

A description will be given of an example of a structure of a multiplier circuit in accordance with a third embodiment. FIG. 7 illustrates a circuit diagram of a multiplier circuit 400 in accordance with the third embodiment. The same components as those illustrated in FIG. 7 have the same reference numerals as FIG. 3. A description will be given of differences between the multiplier circuit 400 and the multiplier circuit 200 of the first embodiment. The other explanation is omitted.

The multiplier circuit 400 is different from the multiplier circuit 200 of the first embodiment in a point that a 90 degrees coupler 29 for a tripled wave acting as a combiner instead of the combiner 28. A resistor R13 coupled to the 90 degrees coupler 29 is a terminal resistor. As well as the combiner 28, the first output signal 33 and the second output signal 34 are input to the 90 degrees coupler 29. And, the 90 degrees coupler 29 restrains leakage of the first output signal 33 or the second output signal 34 from one of the first transistor Q1 and the second transistor Q2 to the other. The 90 degrees coupler 29 makes 90 degrees phase difference between the tripled wave of the second output signal 34 (270 degrees) and the tripled wave of the first output signal 33, and combines the tripled wave of the second output signal 34 and the tripled wave of the first output signal 33 into the output signal 35, and outputs the output signal 35 to the Pout 27. The tripled wave of the first output signal 33 and the tripled wave of the second output signal 34 strengthen with each other at the 90 degrees coupler 29. Therefore, the output of the tripled wave of the output signal 35 is enlarged.

The multiplier circuit 400 is different from the multiplier circuit 200 of the first embodiment in a point that a bias line coupled to the power supply Vd supplying a bias voltage to the first transistor Q1 and the second transistor Q2 is provided before the 90 degrees coupler 29. This is because the 90 degrees coupler 29 cuts direct voltage. A bias line from the power supply Vd to the first transistor Q1 via the resistor R12, the distributed constant lines TL13 and TL12 and the resistor R10 supplies a bias voltage to the first transistor Q1. A bias line from the power supply Vd to the second transistor Q2 via the resistor R12, the distributed constant lines Tl13 and Tl11 and the resistor R11 supplies a bias voltage to the second transistor Q2. The capacitors C7 and C8 coupled between the above-mentioned bias lines and the 90 degrees coupler 29 cut a direct current flowing into the 90 degrees coupler 29.

Table 4 shows an example of parameter of each element of a simulation of frequency characteristics of the multiplier circuit 400 in accordance with the third embodiment. The elements showed in Table 1 through Table 3 are omitted. A micro strip line was used as the distributed constant lines TL12 and TL13. Polyimide was used as the dielectric body in which the distributed constant lines are provided. In the embodiment, thickness of the dielectric body was 4.5 [μm], and relative permittivity was 3.5.

TABLE 4

| | |
|---|---|
| R10 | 350 [Ω] |
| R11 | 350 [Ω] |
| R12 | 25 [Ω] |
| R13 | 50 [Ω] |
| C7 | 0.3 [pF] |
| C8 | 0.3 [pF] |
| C9 | 0.3 [pF] |
| TL12 | L = 500 [μm], W = 10 [μm] |
| TL13 | L = 500 [μm], W = 10 [μm] |

Figure 8:
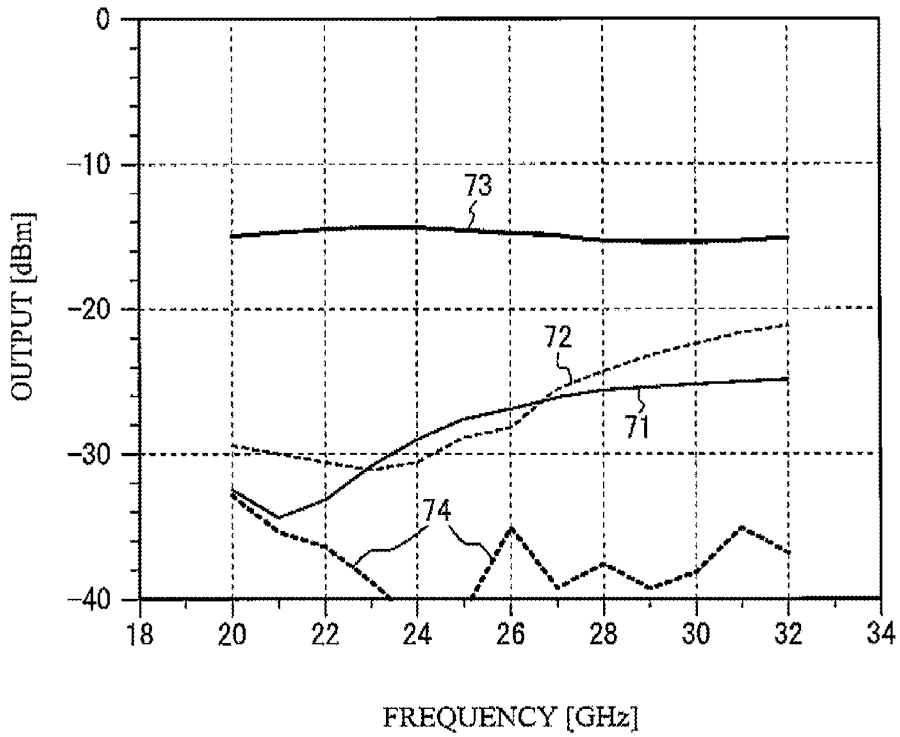
FIG. 8 illustrates an example of a simulation result of frequency characteristics of the multiplier circuit in accordance with the third embodiment.

FIG. 8 illustrates a simulation result of frequency characteristics of the multiplier circuit 400 in accordance with the third embodiment. In FIG. 8, a horizontal axis and a vertical axis are the same as FIG. 2. A solid line 71, a dotted line 72, a solid line 73 and a dotted line 74 indicate changing of the base wave, the doubled wave, the tripled wave and the quadruped wave of the output signal 35 of the multiplier circuit 400 respectively. As illustrated in FIG. 8, the output of the doubled wave of the output signal 35 was suppressed. The output of the tripled wave of the output signal 35 is enlarged more than the doubled wave of the output signal 35 in a wide band. Therefore, the multiplier circuit 400 enlarges the output of the tripled wave in a wide band.

In accordance with the third embodiment, the multiplier circuit 400 has the 90 degrees coupler for tripled wave making 90 degrees phase difference between the tripled wave of the second output signal 34 (270 degrees) and the tripled wave of the first output signal 33, combining the tripled wave of the second output signal 34 and the tripled wave of the first output signal 33 into the output signal 35, and outputting the output signal 35 to the Pout 27. It is therefore possible to enlarge the output of the tripled wave in a wide band.

Fourth Embodiment

Figure 9:
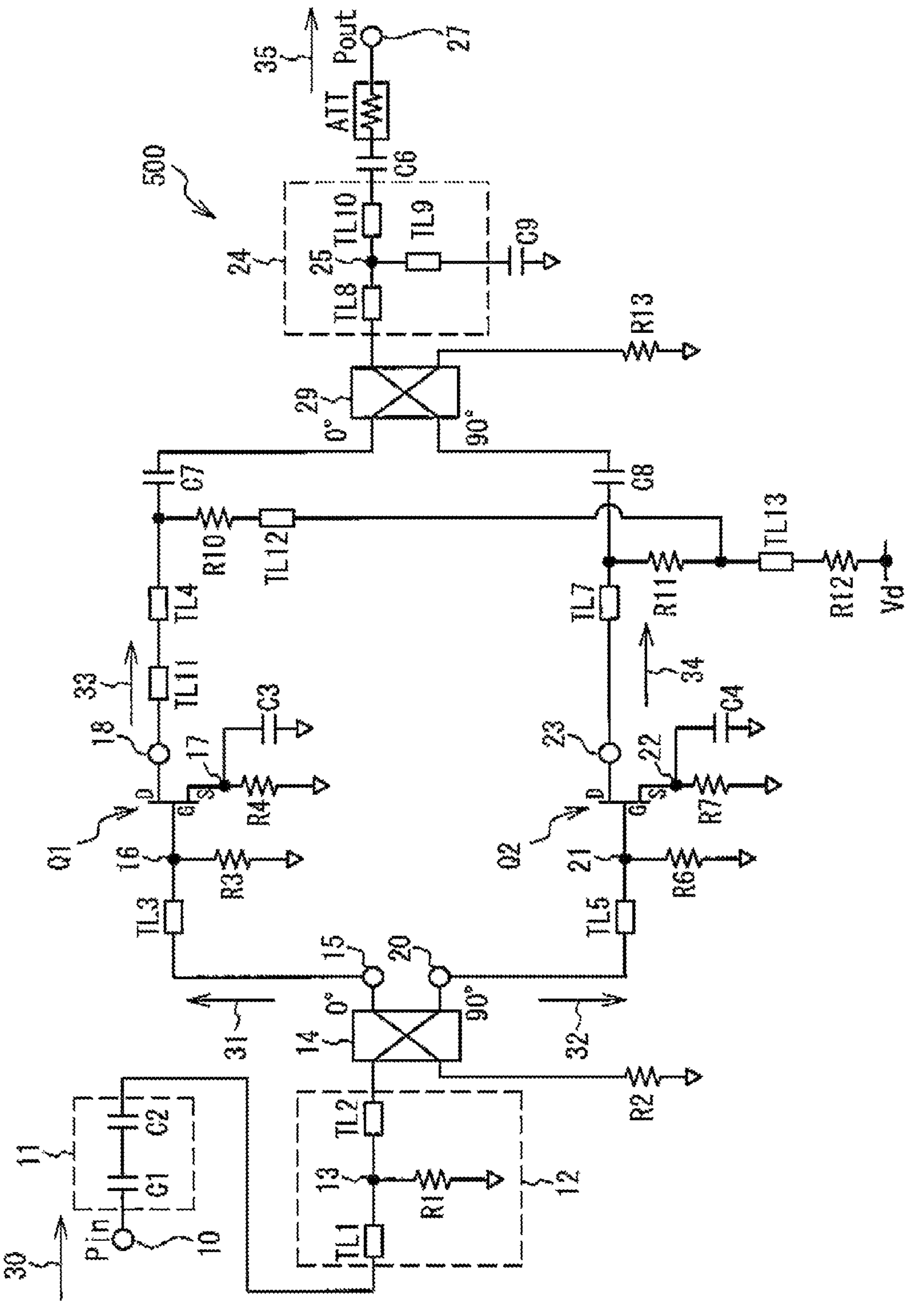
FIG. 9 illustrates a circuit diagram of a multiplier circuit in accordance with a fourth embodiment.

A description will be given of an example of a structure of a multiplier circuit in accordance with a fourth embodiment. FIG. 9 illustrates a circuit diagram of a multiplier circuit 500 in accordance with the fourth embodiment. The same components as those illustrated in FIG. 9 have the same reference numerals as FIG. 7. A description will be given of differences between the multiplier circuit 500 and the multiplier circuit 400 of the third embodiment. The other explanation is omitted.

The multiplier circuit 500 is different from the multiplier circuit 400 of the third embodiment in a point that the distributed constant line TL11 is provided between the drain terminal of the first transistor Q1 and the distributed constant line TL4. The distributed constant line TL11 adjusts the phase of the doubled wave of the first output signal 33 and the phase of the double wave of the second output signal 34 so that the doubled waves are combined at the 90 degrees coupler 29 and thereby have a reverse phase.

Table 5 shows an example of parameter of each element of a simulation of frequency characteristics of the multiplier circuit 500 in accordance with the fourth embodiment. The elements showed in Table 1 through Table 4 are omitted. A micro strip line was used as the distributed constant line TL11. Polyimide was used as the dielectric body in which the distributed constant line is provided. In the embodiment, thickness of the dielectric body was 4.5 [μm], and relative permittivity was 3.5.

TABLE 5

| | |
|---|---|
| TL11 | L = 250 [μm], W = 10 [μm] |

Figure 10:
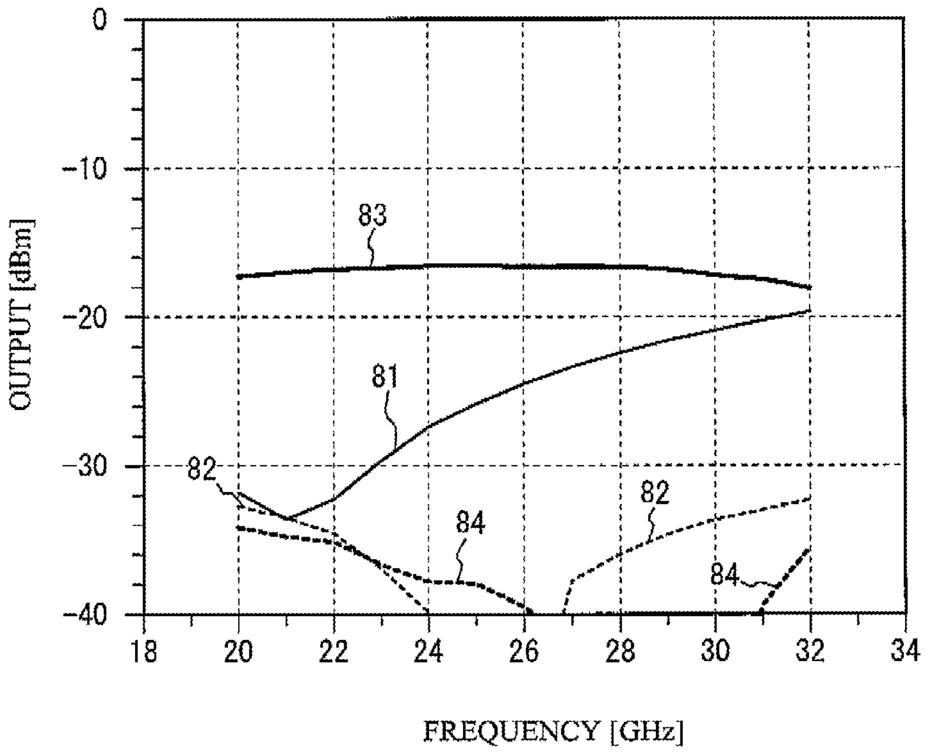
FIG. 10 illustrates an example of a simulation result of frequency characteristics of the multiplier circuit in accordance with the fourth embodiment.

FIG. 10 illustrates a simulation result of frequency characteristics of the multiplier circuit 500 in accordance with the fourth embodiment. In FIG. 10, a horizontal axis and a vertical axis are the same as FIG. 2. A solid line 81, a dotted line 82, a solid line 83 and a dotted line 84 indicate changing of the base wave, the doubled wave, the tripled wave and the quadruped wave of the output signal 35 of the multiplier circuit 500 respectively. As illustrated in FIG. 10, the output of the doubled wave of the output signal 35 was greatly suppressed in a wide band compared to FIG. 8 of the third embodiment. Therefore, the multiplier circuit 500 enlarges the output of the tripled wave of the output signal 35 in a wide band more than the output of the doubled wave of the output signal 35.

In accordance with the fourth embodiment, the multiplier circuit 500 has the distributed constant line TL11. The first terminal of the distributed constant line TL11 is coupled to the drain terminal acting as the first output terminal of the first transistor Q1. The second terminal of the distributed constant line TL11 is coupled to the 90 degrees coupler 29. The distributed constant line TL11 adjusts the phase of the doubled wave of the first output signal 33 so that the 90 degrees coupler 29 acting as a combiner combines the doubled wave of the first output signal 33 and the doubled wave of the second output signal 34 and have a reverse phase with each other. With the structure, the doubled wave of the first output signal 33 and the doubled wave of the second output signal 34 cancel with each other when the 90 degrees coupler 29 combines the first output signal 33 and the second output signal 34. Thus, the doubled wave of the output signal 35 is suppressed. Therefore, the multiplier circuit 500 enlarges the output of the tripled wave in a wide band, and suppresses the output of the doubled wave of the output signal 35 in a wide band, as well as the multiplier circuit 400.

Fifth Embodiment

Figure 11:
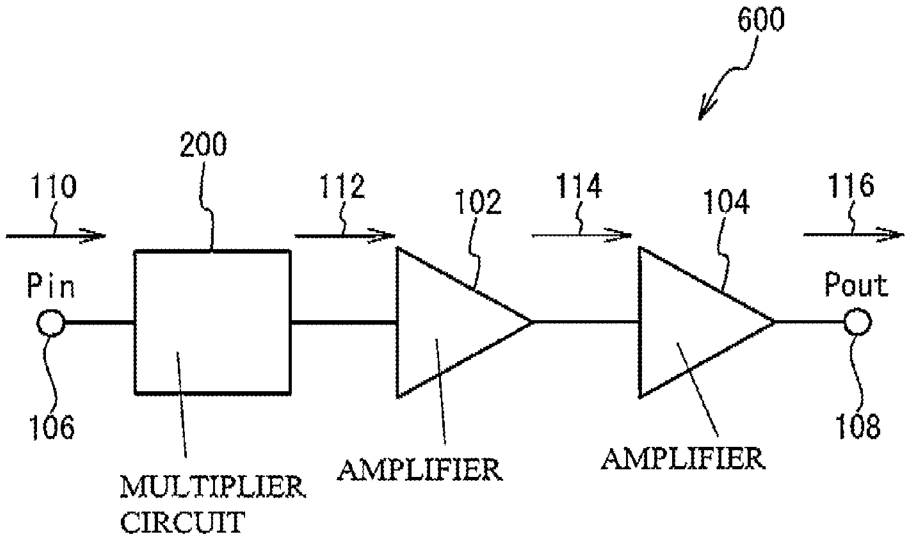
FIG. 11 illustrates a block diagram of a multiplier circuit in accordance with a fifth embodiment.

A description will be given of an example of a structure of a multiplier circuit in accordance with a fifth embodiment. FIG. 11 illustrates a block diagram of a multiplier circuit 600 in accordance with the fifth embodiment. As illustrated in FIG. 11, the multiplier circuit 600 has an input signal terminal Pin 106, the multiplier circuit 200 of the first embodiment, an amplifier 102, an amplifier 104 and an output signal terminal Pout 108. The multiplier circuit 200 may be one of the multiplier circuit 300, the multiplier circuit 400 and the multiplier circuit 500.

The structure of the multiplier circuit 200 is the same as that of the first embodiment. The multiplier circuit 200 receives the signal 110 from the input signal terminal Pin 106. The multiplier circuit 200 outputs a signal 112. The multiplier circuit 200 suppresses the output of the doubled wave of the signal 112 and enlarges the output of the tripled wave of the signal 112.

The amplifier 102 amplifies the signal 112 output from the multiplier circuit 200, and outputs a signal 114. The amplifier 102 is coupled to the output signal terminal Pout 27 of the multiplier circuit 200. With respect to the amplifier 102, a gain band of the base wave of the signal 110 is wider than that of the tripled wave of the signal 110. For example, the amplifier 102 may have a band of the tripled wave of the signal 110 in a band from the maximum value of the gain to −3 dB and may not have a band of the base wave of the signal 110 in the band from the maximum value of the gain to −3 dB. In this case, the output of the base wave from the amplifier 102 is suppressed. The amplifier 104 amplifies the signal 114 output from the amplifier 102 and outputs an output signal 116 to the output signal terminal Pout 108, as well as the amplifier 102. As illustrated in FIG. 13, when the number of the amplifier is two, the tripled wave of the output signal 116 is further amplified. The number of the amplifier is not limited to two.

Figure 12:
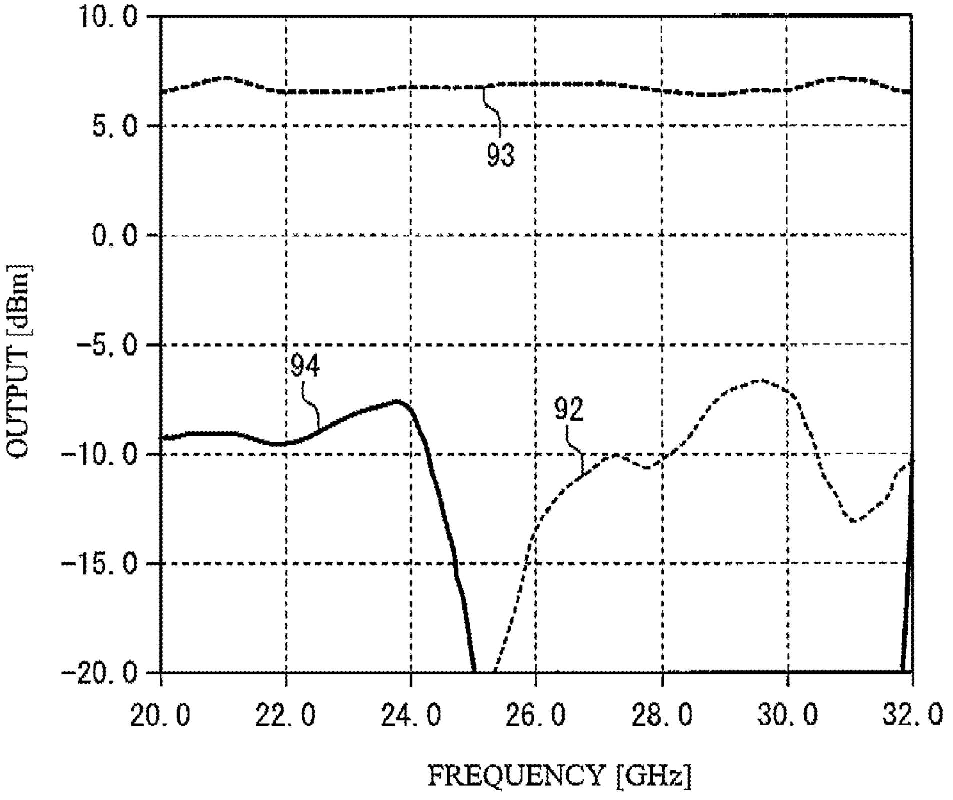
FIG. 12 illustrates an example of a simulation result of frequency characteristics of the multiplier circuit in accordance with the fifth embodiment.

FIG. 12 illustrates a simulation result of frequency characteristics of the multiplier circuit 600 in accordance with the fifth embodiment. In FIG. 12, a horizontal axis and a vertical axis are the same as FIG. 2. A solid line 91, a dotted line 92, a solid line 93 and a dotted line 94 indicate changing of the base wave, the doubled wave, the tripled wave and the quadruped wave of the output signal 35 of the multiplier circuit 600 respectively. A graph of the output of the base wave is not illustrated in FIG. 12, because the output of the base wave is less than −20.0 [dBm]. As illustrated in FIG. 12, the output of the doubled wave and the quadruped wave of the output signal 35 is suppressed, and the tripled wave of the output signal 35 is enlarged in a wide band. Therefore, the multiplier circuit 600 suppresses the output of the base wave and extracts the tripled wave effectively.

In accordance with the fifth embodiment, the multiplier circuit 600 has the amplifier 102. The amplifier 102 is coupled to the combiner 28 of the multiplier circuit 200. With respect to the multiplier circuit 600, the gain of the tripled wave of the signal 110 has a band that is wider than that of the base wave of the signal 110. The amplifier 104 coupled after the amplifier 102 has the same characteristics as the amplifier 102. Thus, the output of the base wave is suppressed, and the tripled wave is extracted effectively.

In accordance with the fifth embodiment, the amplifier 102 may have a band of the tripled wave of the signal 110 in a band from the maximum value of the gain to −3 dB and may not have a band of the base wave of the signal 110 in the band from the maximum value of the gain to −3 dB.

In the comparative example and the embodiments, the phase of the base wave, the doubled wave, the tripled wave and the quadruped wave is 0 degree, 90 degrees, 180 degrees, 270 degrees and 360 degrees. However, the phase may be shifted as long as the effect of the present invention is obtained. For example, the phase may be shifted within +20 degrees to −20 degrees. It is preferable that the phase may be shifted within +10 degrees to −10 degrees. It is more preferable that the phase may be shifted within +5 degrees to −5 degrees.

In the comparative example and the embodiments, the first transistor Q1 and the second transistor Q2 may be a GaAs-based HEMT (High Electron Mobility Transistor), a bipolar transistor, an FET (Field Effect Transistor) or the like. It is preferable that the first transistor Q1 and the second transistor Q2 have the same size and the same connection so that the characteristics other than phase of the first output signal 33 and the second out put signal 34 are the same. The source is grounded in the above embodiments as en example of a connection of the first transistor Q1 and the second transistor Q2. However, the gate may be grounded, or the drain may be grounded. When the first transistor Q1 and the second transistor Q2 are the bipolar transistor, one of an emitter, a base or a collector has only to be grounded. The micro strip line is used as the distributed constant line in the above embodiments. However, a coplanar strip line may be used as the distributed constant line. The values of the parameter of each element of Table 1 through Table 5 are an example. Therefore, the values may be different from them.

The present invention is not limited to the specifically disclosed embodiments and variations but may include other embodiments and variations without departing from the scope of the present invention.

What is claimed is:

1. A multiplier circuit comprising:

a 90 degrees coupler that divides an input signal into a first input signal and a second input signal of which phase difference of a frequency of a base wave of the input signal is 90 degrees, and outputs the first input signal and the second input signal;

a first transistor that receives the first input signal and outputs a first output signal including at least a doubled wave and a tripled wave of the first input signal;

a second transistor that receives the second input signal and outputs a second output signal including at least a doubled wave and a tripled wave of the second input signal; and a combiner that receives the first output signal and the second output signal, restrains leakage of the first output signal or the second output signal from one of the first transistor and the second transistor to the other, combines the first output signal and the second output signal, and outputs an output signal of the tripled wave, wherein:

the combiner has a coupling point, a first resistor, and a second resistor;

a first terminal of the first resistor is coupled to the first transistor;

a second terminal of the first transistor is coupled to the coupling point;

a first terminal of the second resistor is coupled to the second transistor; and a second terminal of the second resistor is coupled to the coupling point.

2. The multiplier circuit as claimed in claim 1 further comprising a distributed constant line, wherein:

a first terminal of the distributed constant line is coupled to the second transistor, a second terminal of the distributed constant line is coupled to a first terminal of the second resistor; and the distributed constant line adjusts a phase of a tripled wave of the second output signal so that a tripled wave of the first output signal and a tripled wave of the second output signal get closer to an in-phase at the combiner.

3. The multiplier circuit as claimed in claim 1, wherein a resistance value of the first resistor is equal to that of the second resistor.

4. The multiplier circuit as claimed in claim 1, wherein the combiner is a 90 degrees coupler that makes 90 degrees phase difference between the tripled wave of the first output signal and the tripled wave of the second output signal, and combines the tripled wave of the second output signal and the tripled wave of the first output signal.

5. The multiplier circuit as claimed in claim 4 further comprising a distributed constant line, wherein:

a first terminal of the distributed constant line is coupled to the first transistor, a second terminal of the distributed constant line is coupled to the combiner; and the distributed constant line adjusts a phase of the doubled wave of the first output signal so that the doubled wave of the first output signal and the doubled wave of the second output signal are combined with a reverse phase from each other.

6. The multiplier circuit as claimed in claim 1 further comprising an amplifier that is coupled to the combiner and has a gain band of the base wave wider than that of the tripled wave.

7. The multiplier circuit as claimed in claim 6, wherein the amplifier has a band of the tripled wave in a band from a maximum value of a gain to −3 dB and does not have a band of the base wave in the band from a maximum value of a gain to −3 dB.

8. A multiplier circuit comprising:

a coupler that divides an input signal into a first input signal and a second input signal having a phase difference of 90 degrees to the first input signal;

a first transistor that receives the first input signal and outputs a first output signal including at least a doubled wave and a tripled wave of the first input signal;

a second transistor that receives the second input signal and outputs a second output signal including at least a doubled wave and a tripled wave of the second input signal; and a combiner that combines the first output signal and the second output signal, and outputs an output signal of the tripled wave, wherein:

the combiner has a coupling point, a first resistor, and a second resistor;

a first terminal of the first resistor is coupled to the first transistor;

a second terminal of the first transistor is coupled to the coupling point;

a first terminal of the second resistor is coupled to the second transistor; and a second terminal of the second resistor is coupled to the coupling point.

9. The multiplier circuit as claimed in claim 8 further comprising a distributed constant line, wherein:

a first terminal of the distributed constant line is coupled to the second transistor; and a second terminal of the distributed constant line is coupled to a first terminal of the second resistor.

10. The multiplier circuit as claimed in claim 8, wherein a resistance value of the first resistor is equal to that of the second resistor.

11. The multiplier circuit as claimed in claim 8, wherein the combiner is a 90 degrees coupler that makes 90 degrees phase difference between the tripled wave of the first output signal and the tripled wave of the second output signal, and combines the tripled wave of the second output signal and the tripled wave of the first output signal.

12. The multiplier circuit as claimed in claim 11 further comprising a distributed constant line, wherein:

a first terminal of the distributed constant line is coupled to the first transistor and;

a second terminal of the distributed constant line is coupled to the combiner.

13. The multiplier circuit as claimed in claim 8 comprising an amplifier that is coupled to the combiner and has a gain band of the base wave wider than that of the tripled wave.

14. The multiplier circuit as claimed in claim 13, wherein the amplifier has a band of the tripled wave in a band from a maximum value of a gain to −3 dB and does not have a band of the base wave in the band from a maximum value of a gain to −3 dB.

* * * * *